(12) United States Patent
Kim

(10) Patent No.: US 6,452,847 B2
(45) Date of Patent: Sep. 17, 2002

(54) TESTABLE NONVOLATILE SEMICONDUCTOR DEVICE

(75) Inventor: Myong-Jae Kim, Kyunggi-do (KR)

(73) Assignee: Samsung Electronics Co., Ltd., Hwasung (KR)

(*) Notice: Subject to any disclaimer, the term of this patent is extended or adjusted under 35 U.S.C. 154(b) by 0 days.

(21) Appl. No.: 09/855,275

(22) Filed: May 14, 2001

(30) Foreign Application Priority Data

Jul. 13, 2000 (KR) .......................................... 2000-40215

(51) Int. Cl.$^7$ .............................................. G11C 29/00
(52) U.S. Cl. .................................. 365/201; 365/230.08
(58) Field of Search ........................... 365/201, 230.01, 365/230.08, 233

(56) References Cited

U.S. PATENT DOCUMENTS 5,185,744 A * 2/1993 Arimoto et al. ............ 371/21.2
6,026,039 A * 2/2000 Kim et al. .................. 365/201

* cited by examiner

Primary Examiner—Michael S. Lebentritt
Assistant Examiner—Anh Phung
(74) Attorney, Agent, or Firm—Marger Johnson & McCollom, P.C.

(57) ABSTRACT

Disclosed is a semiconductor memory device having the least pin counts per chip to test the maximum number of chips in a single wafer at a time. The semiconductor memory device includes an address counter generating a plurality of address signals in response to a signal provided from the outside, an address selection circuit controlling a path of the address signals, a plurality of switches divided in a predetermined number of switch groups and connected between a memory array and data input/output pins, and a switch control circuit generating switch control signals to control a switching operation of the switch groups. A portion of the data input/output pins is employed in correspondence with the number of the switch groups.

12 Claims, 7 Drawing Sheets

TESTABLE NONVOLATILE SEMICONDUCTOR DEVICE

This application relies for priority upon Korean Patent Application No. 2000-40215, filed on Jul. 13, 2000, the contents of which are herein incorporated by reference in their entirety.

FIELD OF THE INVENTION

The present invention relates generally to semiconductor devices, and more particularly to a flash memory device having the least number of pins assigned on a single chip for increasing testing speed at a wafer level.

BACKGROUND OF THE INVENTION

Applications of a flash memory have been extended because of the excellent operating speed and integration relative to other nonvolatile memory devices. In a memory cell formed of source and drain regions, a floating gate, and a control gate, various operations, such as programming, erasing, verifying, and reading, are performed. The programming injects an electron to the floating gate, and the erasing tunnels the electron from the floating gate to a channel region. As known in the art, varied testing operations are performed to identify the reliability of memory devices including the flash memory at a wafer level and at a package level. In general, one chip of a plurality of flash memory chips in a single wafer is tested at the wafer level, which causes an increasing time for the test in accordance with the increased memory device density.

SUMMARY OF THE INVENTION

It is therefore an object of the present invention to provide a flash memory device for decreasing a testing time. It is another object of the invention to provide a device for testing more flash memories in shorter time at wafer level.

It is still another object of the invention to a method for testing more flash memories in shorter time at wafer level.

In order to attain the above objects, according to an aspect of the present invention, there is provided a semiconductor memory device having the least number of pins assigned on a single chip to test the maximum number of chips in a wafer at a time.

The semiconductor memory device in the present invention, includes an address counter generating a plurality of address signals in response to a signal provided from the outside, an address selection circuit controlling a path of the address signals, a plurality of switches divided in a predetermined number of groups and connected between a memory array and data input/output pins, and a switch control circuit generating switch control signals to control a switching operation of the switch groups in response to the external input signal. A portion of the data input/output pins is employed in correspondence with the number of the switch groups.

According to another aspect of this invention, there is provided a semiconductor device including a plurality of memory chips formed in a single wafer, each memory chip being connected to a source voltage pin, an earth voltage pin, a predetermined number of control signal pins, a test enable signal pin, a clock signal pin, and a portion of a plurality of data input/output pins. The respective memory chips include an input/output counter generating a plurality of counting signals in response to a test enable signal and a clock signal, an address counter generating a plurality of address signals in response to a counting signal, an address selection circuit controlling a path of the address signals, a plurality of switches divided into a predetermined number of switch groups and connected between a memory array and the data input/output pins, and a switch control circuit generating switch control signals to control a switching operation of the switch groups. The portion of the data input/output pins corresponds to the number of the switch groups.

According to the semiconductor device of the invention, it is possible to be applied to a write-in test as well as a read-out test, because the switches are bi-directionally operable.

The foregoing features and advantages of the invention will be more fully described in the accompanying drawings.

BRIEF DESCRIPTION OF THE DRAWINGS

The present invention will be described by way of exemplary embodiments, but not limitations illustrated in the accompanying drawings in which like references denote similar elements, and in which.

DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

In the accompanying drawings of the invention, signals prefixed with 'n' mean that the signals are activated on low level.

Figure 1:
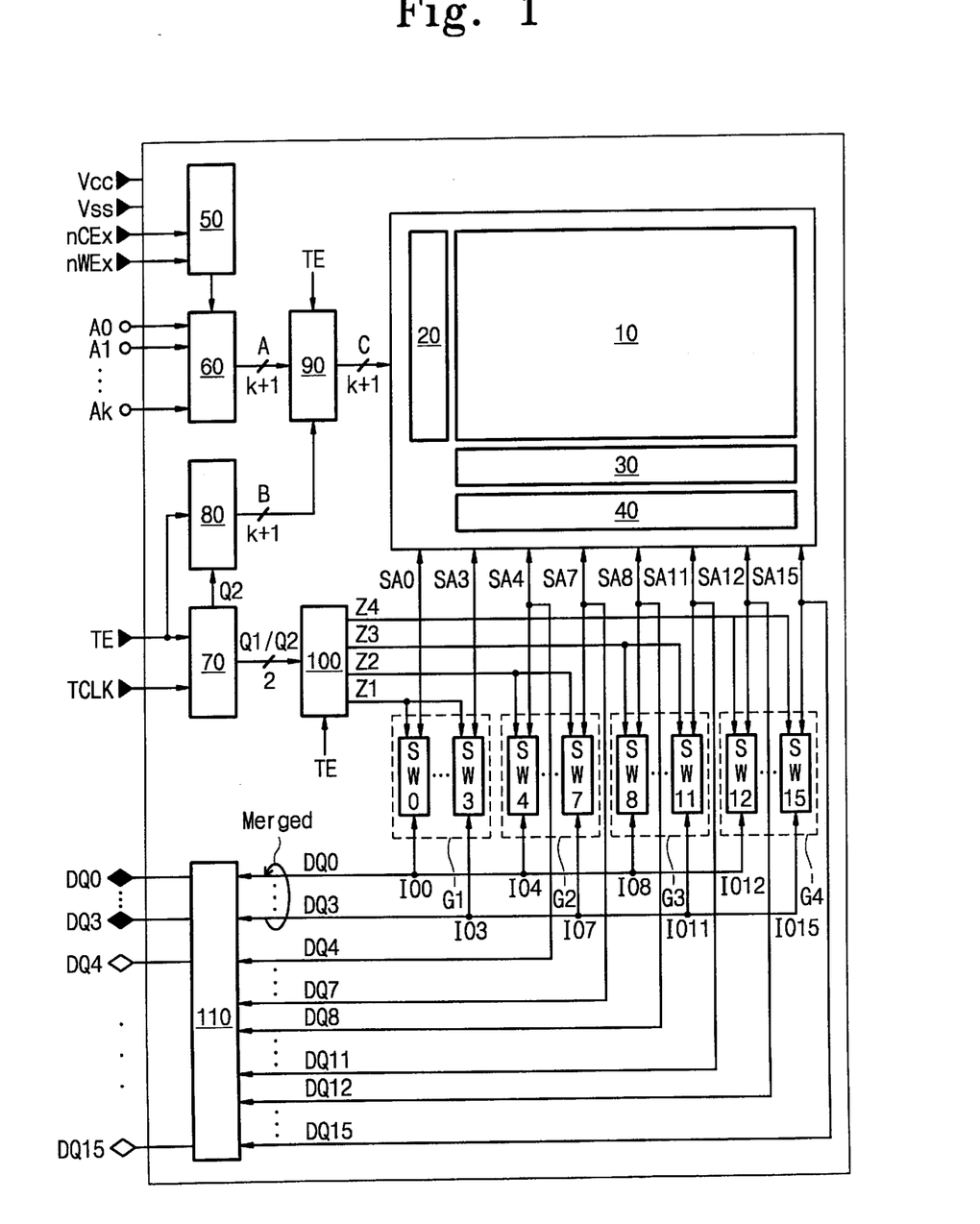
FIG. 1 is a block diagram showing a flash memory device being provided for a test operation according to a preferred embodiment of the invention.

FIG. 1 shows an internal constitution of a flash memory device with a pin arrangement of the invention. Only the pins colored in black are used for a test operation.

Referring to FIG. 1, control pins nCEx, nWEx, TE, TCLK required basically for controlling a parallel test are utilized to minimize the number of pins assigned on a single chip in the parallel test at a wafer level, excluding address pins A0 through Ak. If the flash memory device treats 16 data bits, a part of sixteen input/output pins DQ0 through DQ15 is utilized, merging the rest of the input/output pins into the using pins (DQ-merged arrangement). In other words, the test uses a source voltage pin Vcc, an earth voltage pin Vss, a chip enable pin nCEx, a write enable pin nWEx controlling a command input, a test enable pin TE activating a parallel test mode, a clock pin TCLK operating an internal counter, and partial input/output pins DQ~DQ3.

The number of the usable input/output pins is dependent upon input/output processing speed determined by a data size being input/output at once, and the number of parallel testable chips in a single wafer. The number of the parallel testable chips is inversive to that of pins assigned in a single chip. That is, if the number of the usable input/output pins is too many, the total number of pins assigned in a single chip are increased within the number of defined usable pins, so that the number of the synchronous testable chips are decreased. Conversely, if the usable input/output pin counts are too small, the number of the synchronous parallel testable chips may be increased, prolonging time duration for the data input/output, whereby the parallel testing time is increased in total. Considering such parameters, it is preferable to use four input/output pins among sixteen pins.

Continuing to refer to FIG. 1, the chip enable pin nCEx and the write enable pin nWEx are provided to a control signal input buffer 50, and the buffer 50 generates a control signal for controlling an address buffer 60 in response to the pins nCEx and nWEx. The address buffer 60 connected to the normal address pins A0~Ak applies address signals A (k+1) converted into CMOS level to an address selection circuit 90. An input/output counter 70 receiving the test enable pin TE and the clock pin TCLK generates counting output signals Q1 and Q2. The two counting output signals Q1 and Q2 are associated with the number of the usable input/output pins, i.e. 4 in the invention, whereby four (=$2^2$) signals are required to control an input/output switch. The counting signals Q1 and Q2 are applied to a switch control circuit 100, and the signal Q2 is applied to an address counter 80. The address counter 80 generates a plurality of address signals B (k+1) for the parallel test from the counting signal Q2 in response to the test enable pin TE. The normal address signals A, provided from the address buffer 60, and the address signals B for the test, provided from the address counter 80, select their paths in accordance with a logic state of the test enable pin TE in the address selection circuit 90, so that the address signals A and B generated as final address signals C (k+1) are provided to a row decoder 20 and a column decoder 30. The address signals C provided from the address selection circuit 90 are identical with the address signals B provided from the address counter 80 in the parallel test mode, while being identical with the address signals A provided from the address buffer 60 in a normal mode.

Figure 2:
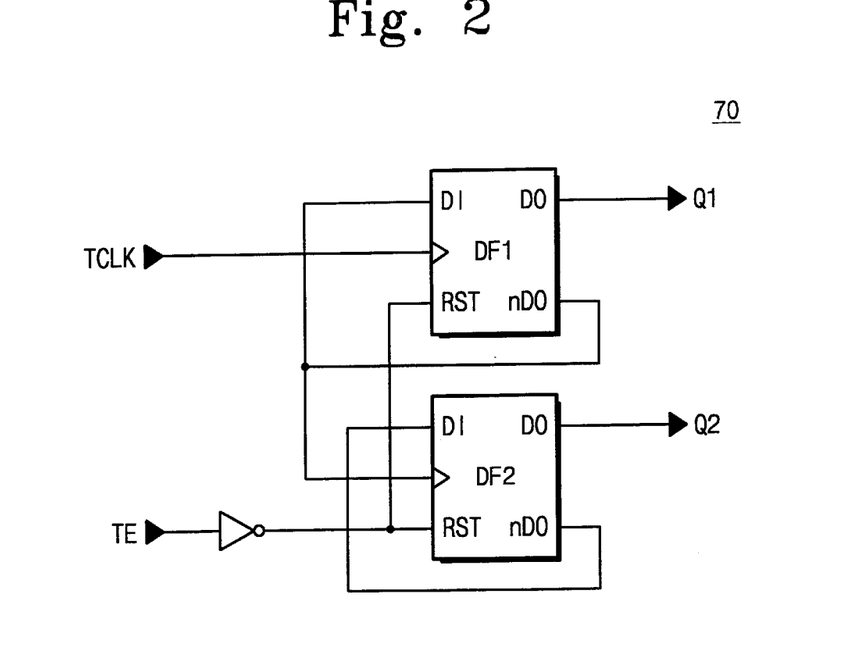
FIG. 2 is a circuit diagram showing an input/output counter shown in FIG. 1.
Figure 7:
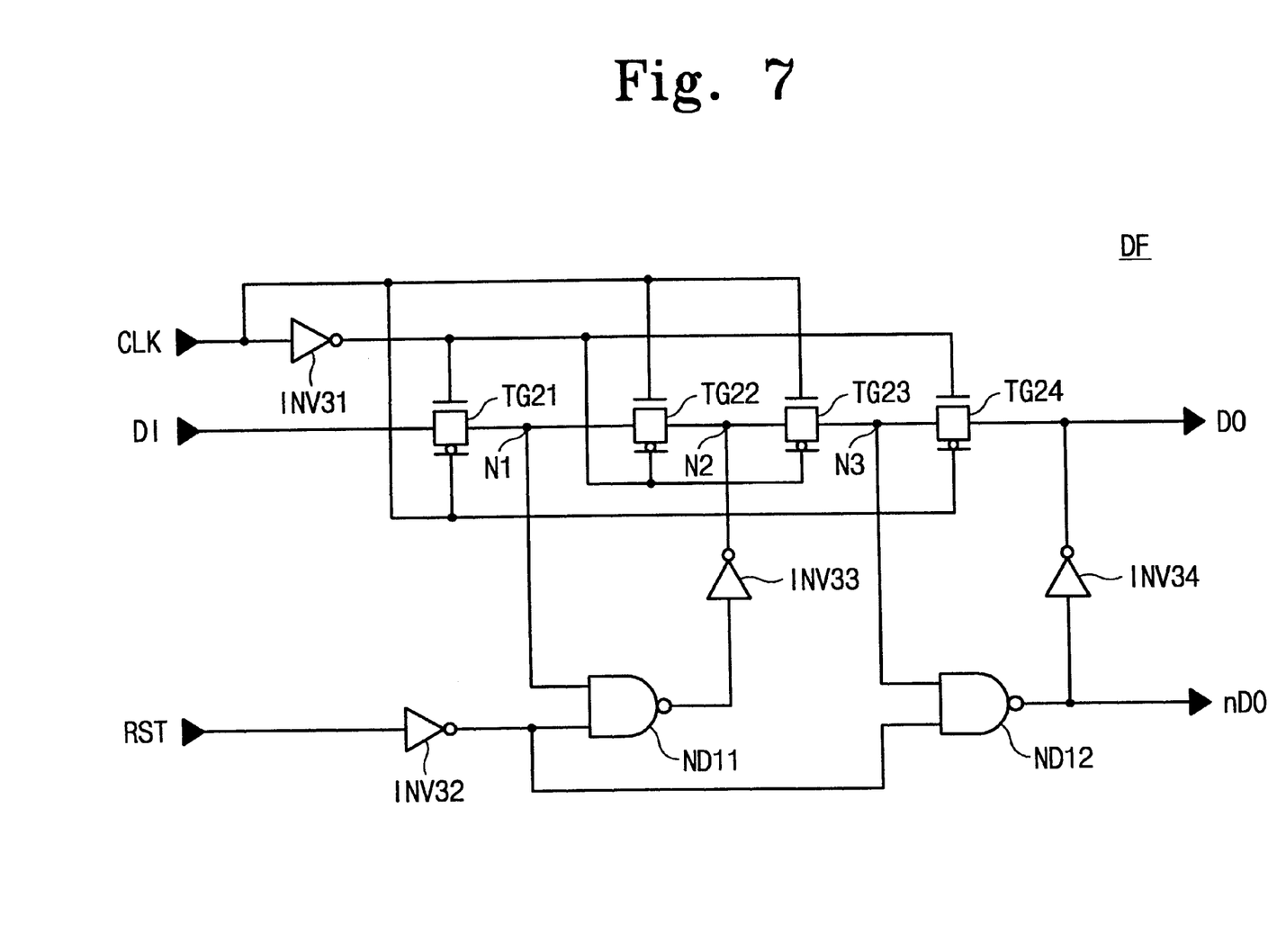
FIG. 7 is a circuit diagram showing a D-flip-flop being utilized in the present invention.

A data input/output buffer 110 connected with the usable input/output pins DQ0~DQ3 for the parallel test of the invention is connected bi-directionally with switches SW0 through SW15 corresponding to the 16 data bits. Further, each of the switches SW0~SW15 is connected bi-directionally to a sense amplifier and latch circuit corresponding thereto in a sense amplifier and latch circuit 40. As the number of the usable input/output pins is four, the switches SW0~SW15 are divided into four group G1~G4. Briefly, a first group G1 is formed of four switches SW0~SW3, a second group G2 of SW4~SW7, a third group G3 of SW8~SW11, and a fourth group G4 of SW12~SW15. Each of the switch groups G1~G4 transmits output data signals SA0~SA15 of the sense amplifier and latch circuit 40 to the data input/output buffer 110 in a read-out test operation, or transmits a data of the data input/output buffer 110 to the sense amplifier and latch circuit 40 in a write-in test operation in response to switch control signals Z1~Z4 provided from the switch control circuit 100. When the first switch control signal Z1 is activated, the switches SW0~SW3 (or IO0~IO3) in the first group G1 are connected to the input/output pins DQ0~DQ3, and when the second switch control signal Z2 is activated, the switches SW4~SW7 (or IO4~IO7) in the second group G2 are connected to the input/output pins DQ0~DQ3. When the third switch control signal Z3 is activated, the switches SW8~SW11 (or IO8~IO11) in the third group G3 are connected to the pins DQ0~DQ3, and when the fourth switch control signal Z4 is activated, the switches SW12~SW15 (or IO12~IO15) in the fourth group G4 are connected to the pins FIG. 2 shows an internal constitution of the input/output counter 70 of FIG. 1. Two D-flip-flops DF1 and DF2 are serially connected to generate two counting signals Q1 and Q2. The test enable signal TE is commonly applied reset terminals RST, and an output terminal DO of the first D-flip-flop DF1 is connected to an input terminal DI of the second D-flip-flop DF2. Respective input terminals DI are connected with the second output terminals nDO in the D-flip-flops DF1 and DF2. The first output terminals DO of the D-flip-flops DF1 and DF2 provide the counting signals Q1 and Q2. An internal constitution of the D-flip-flop is shown in FIG. 7.

Figure 3:
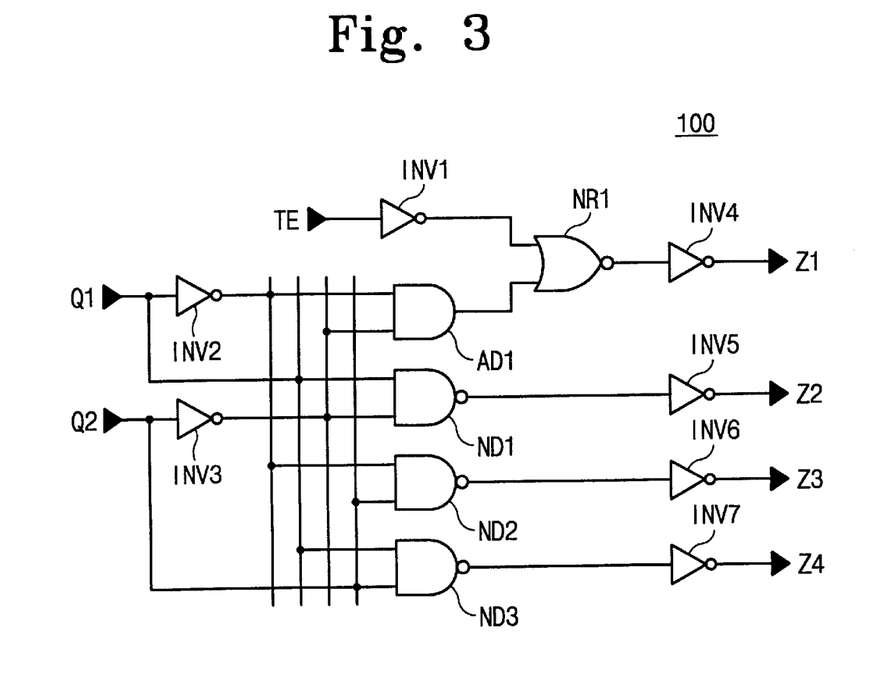
FIG. 3 is a circuit diagram showing a switch control circuit shown in FIG. 1.

FIG. 3 shows a constitution of the switch control circuit 100 generating the four switch control signals Z1~Z4 by receiving the counting output signals Q1 and Q2. The test enable pin TE is applied a first NOR gate NR1 via a first inverter INV1, and an output of a first AND gate AD1 is connected to the other input of the NOR gate NR1. The first NOR gate NR1 is connected to the first switch control signal Z1 through a fourth inverter INV4. A first inverse signal nQ1 of the counting signal Q1 through a second inverter INV2 is applied to the first AND gate AD1, and the second inverse signal nQ2 of the counting signal Q2 through a third inverter INV3 is applied to the other input of the AND gate AD1. A first NAND gate ND1 receives the counting signal Q1 and the second inverse signal nQ2, and provides the second switch control signal Z2 through a fifth inverter INV5. A second NAND gate ND2 generates the third switch control signal Z3 through a sixth inverter INV6 after receiving the first and second inverse signals nQ1 and nQ2. A third NAND gate ND3 generates the fourth switch control signal Z4 through a seventh inverter INV7 after receiving the counting signals Q1 and Q2. As shown in FIG. 3, the first switch control signal Z1 is also generated when the test enable pin TE is activated on high level. Accordingly, the switches SW0~SW3 in the first group G1 shown in FIG. 1 do not provide a path for directly connecting the sense amplifier and latch circuit 40 with the data input/output buffer 110, apart from the other switch groups G2~G4. Thus, the first switch group G1 is utilized as the path for the normal mode as well as the parallel test mode, while the other switch groups G2~G4 are utilized as the data path only in the parallel test mode.

Figure 4:
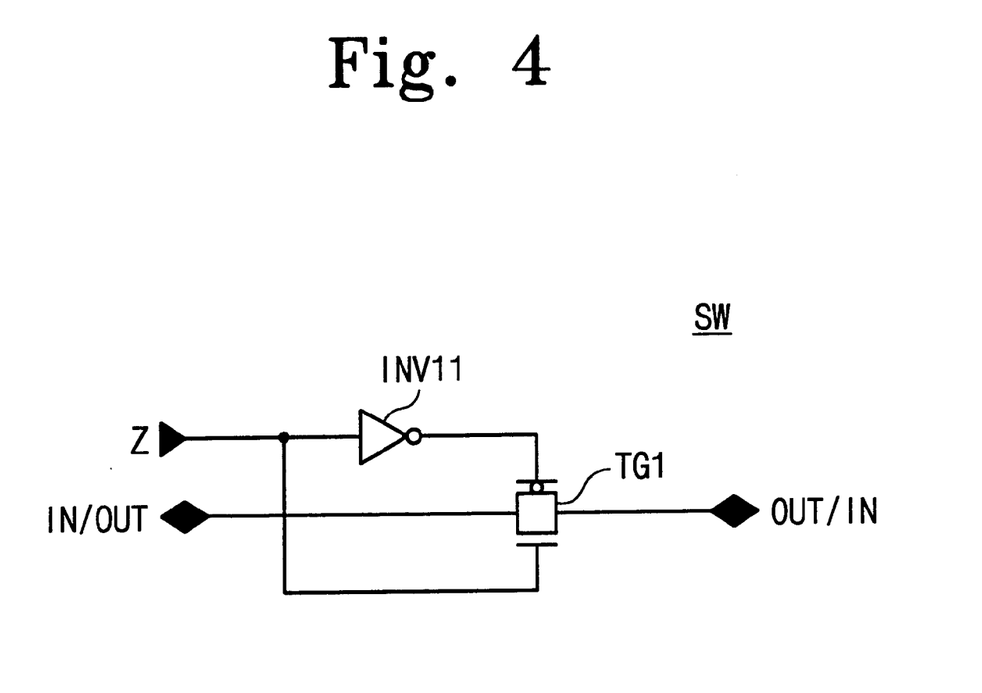
FIG. 4 is a circuit diagram showing a switch shown in FIG. 1.

FIG. 4 is a circuit diagram showing an internal constitution of the switch SW shown in FIG. 1. Referring to FIG. 4, the switch SW is designed to be operable in the bi-directional data transmissions for both read-out and write-in modes. A first transmission gate TG1 having a P-type and N-type electrodes is controlled by one switch control signal Z among the signals Z1~Z4.

Figure 5:
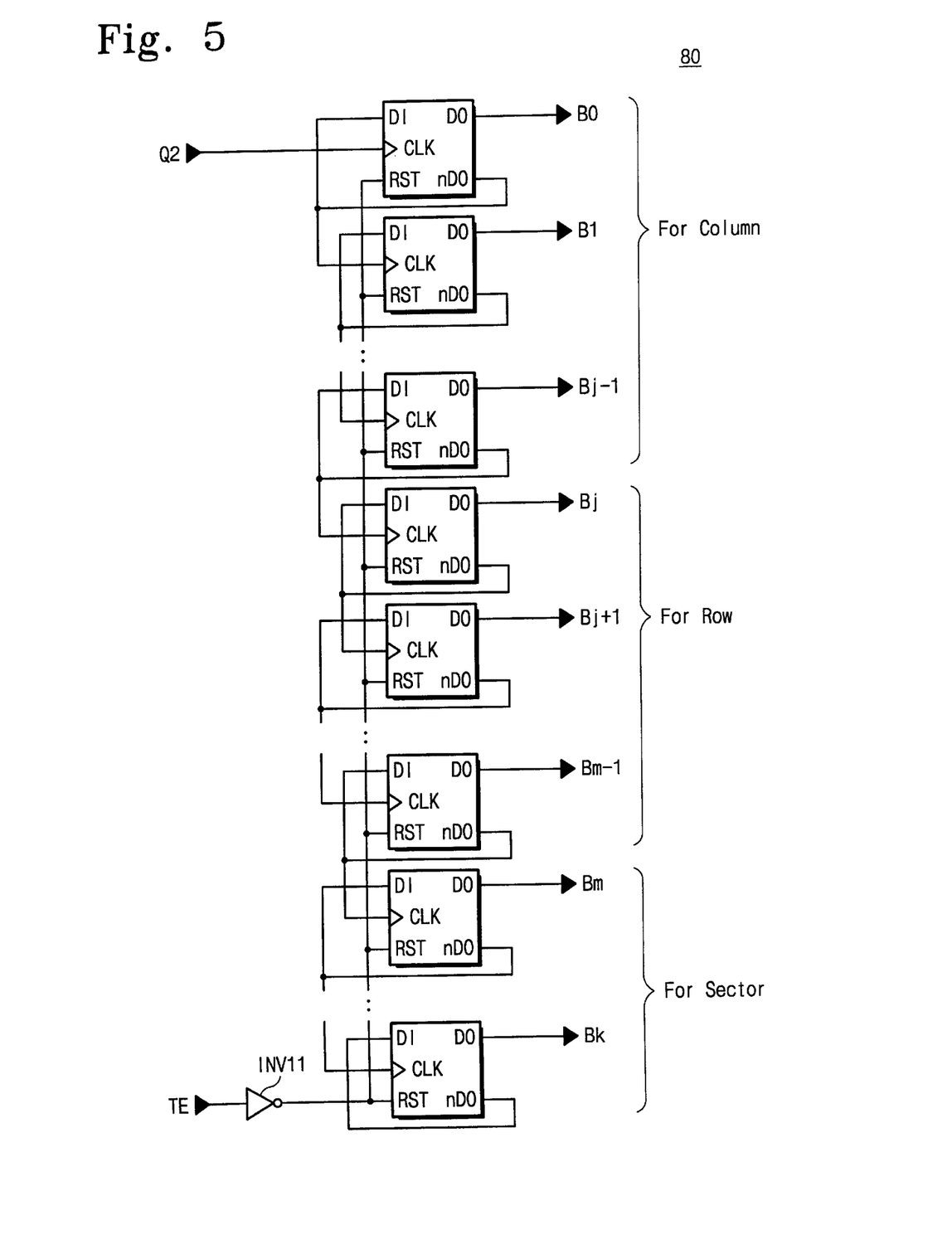
FIG. 5 is a circuit diagram showing an address counter shown in FIG. 1.

The address signals B used for the parallel test are internally generated in the address counter 80 shown in FIG. 5, for the address pins A0~Ak are excluded for the least number of the pins to be used in the parallel test, as the foregoing descriptions. Referring to FIG. 5, the address counter 80 includes the D-flip-flops, corresponding to the required address signals (k), connected in series. The connection of the D-flip-flops is identical with that in the input/output counter 70 shown in FIG. 2.

Typically, a memory array 10 is divided into a unit of sector which consists of a row and a column. In accordance with the hierarchical constitution of the memory array 10, the addresses B0~Bk are divided into groups for column, row, and sector in order, along the direction of bit increment from lower bits to higher bits. In other word, among address signals B0~Bk provided from the D-flip-flops shown in FIG. 5, the signals B0~Bj-1 are used for selecting the column, the signals Bj~Bm-1 and Bm~Bk are used for selecting the row and the sector, respectively. The flip-flop in a first stage generates a first bit B0 of the address signals B0~Bk in response to the counting signal Q2 provided from the input/output counter 70. The counting signal Q2 has four times clock cycle as long as the clock signal TCLK. In the state of four divided input/output data groups, the initial input having four times cycles causes the addresses to be increased along an order of column-row-sector in every four clocks, in accordance with data IO3~IO0, IO7~IO4, IO11~IO8 or IO15~IO12 in each group being inputted or provided through the input/output pins DQ0~DQ3 in every clocks of the clock signal TCLK.

Figure 6:
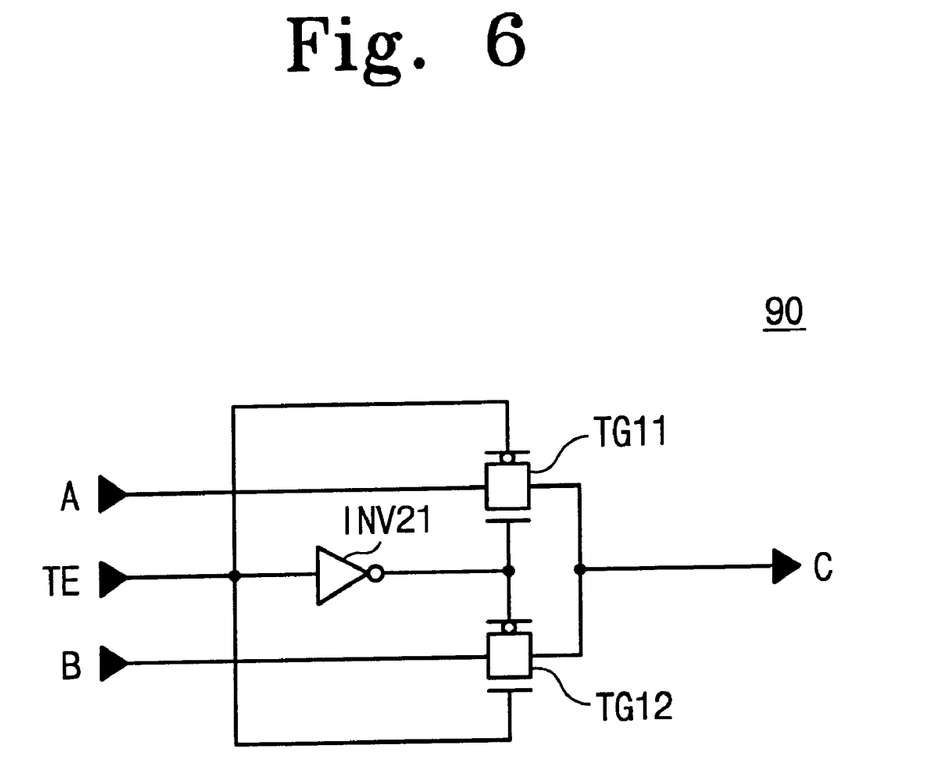
FIG. 6 is a circuit diagram showing an address selection circuit shown in FIG. 1.

FIG. 6 shows the address selection circuit 90. When the test enable signal TE is activated on high level, the transmission gate TG11 is turned off and the transmission gate TG12 is turned on. As a result, the internal address signals B0~Bk for the parallel test generated in the address counter 80 are transmitted to the row and column decoders 20 and 30. The example of D-flip-flop DF shown FIG. 7 is for the input/output counter 70 of FIG. 2 and for the address counter 80 of FIG. 5. Four transmission gates TG21~TG24 are connected in series between the input terminal DI and output terminal DO, and the data paths thereof are turned on or off in response to a switching signal CLK. When the test enable signal TE as a reset signal is provided from the reset terminal RST, the output terminal DO is established on low level.

Figure 8:
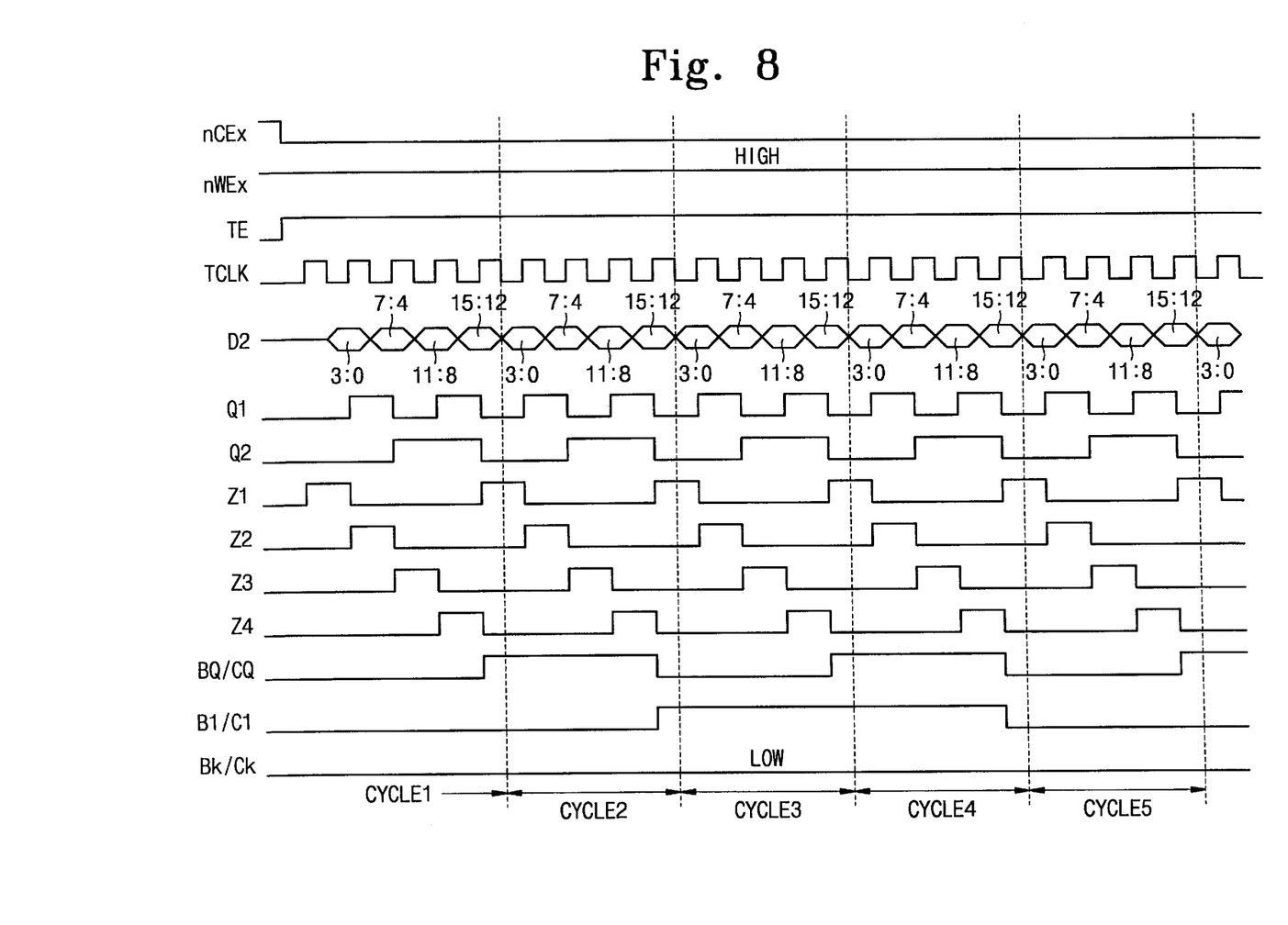
FIG. 8 is a timing diagram showing a test operation according to a preferred embodiment of the present invention.

Next, with reference to a timing diagram of FIG. 8, the parallel test operation in the present invention will be explained. The parallel test operation is common to the read-out test for testing a read-out function of data from memory cells and the write-in test for testing a write-in function of data to memory cells, in accordance with a direction of data transmission.

The parallel test begins by activating the chip enable pin nCEx on low level to operate the memory device, and the write enable pin nWEx controlling a command input is inactivated on high level. The test enable pin TE is activated on high in the test mode. As the clock pin TCLK is oscillated, the counting signals Q1 and Q2 to be generated in the input/output counter 70, whereby the switch control signals Z1~Z4 and address signals B0~B4 are generated from the switch control circuit 100 and the address counter 80, respectively. As the first switch control signal Z1 is activated on high level when the counting signal Q1 and Q2 are the low level, the switches SW0~SW3 in the first group G1 are turned on for connecting the corresponding data IO0~IO3 to the output terminals DQ0~DQ3. When the counting signal Q1 goes up to low level, the first switch control signal Z1 is inactivated on low level, while the second switch control signal Z2 is activated on high level. The switches SW4~SW7 in the second group G2 controlled by the second switch control signal Z2 are turned on, and the data (IO4~IO7) corresponding thereto is connected to the output terminals DQ0~DQ3. Sequentially, in accordance with the counting signal Q1 being turned to low level with Q2 being turned to high level, the second switch control signal Z2 is inactivated to the low level, and the third switch control signal Z3 is activated on high level. The switches SW8~SW11 in the third group G3 are accordingly turned on in response to the high-leveled third switch control signal Z3, and data (IO8~IO11) corresponding thereto is connected to the output terminals DQ0~DQ3. Thereafter, if the counting signal Q1 turns to high level with the counting signal Q2 being turned to high level, the third switch control signal Z3 is inactivated on low level while the fourth switch control signal Z4 is activated on high level. In response to the high-leveled switch control signal Z4, the switches SW12~SW15 in the fourth group G4 are turned on for the corresponding data IO12~IO15 to be connected to the output terminals DQ0~DQ3.

The period in which the data groups IO0~IO3, IO4~IO7, IO8~IO11, and IO12~IO15 are sequentially and selectively connected to the output terminals DQ0-DQ3 is one test cycle CYCLE1 which is performed by a single address. For the next cycle CYCLE2, the address is increased, for example, from "000..000 " to "000..001", and the operation described above is repeatedly performed in every test cycles. Since one test cycle is performed on each address, the total number of the cycles becomes are 2k (k; the number of address bits).

As the forgoing descriptions, the semiconductor device of the present invention is able to perform more effective test by minimizing the number of pins assigned on a signal chip within a limit of retaining the test speed.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A semiconductor device comprising:
   a. an address counter generating a plurality of address signals in response to a signal provided from the outside;
   b. an address selection circuit controlling a path of the address signals;
   c. a plurality of switches divided in a predetermined number of switch groups and connected between a memory array and data input/output pins; and
   d. a switch control circuit generating switch control signals to control a switching operation of the switch groups in response to the external input signal, wherein a portion of the data input/output pins is employed in correspondence with the number of the switch groups.

2. The semiconductor device of claim 1, wherein the switches are designed as bi-directional data transmissions.

3. The semiconductor device of claim 1, wherein the semiconductor device is a nonvolatile memory device.

4. A semiconductor device including a plurality of memory chips in a wafer, each memory chip, connected to a source voltage pin, an earth voltage pin, a predetermined number of control signal pins, a test enable signal pin, a clock signal pin, and a portion of a plurality of data input/output pins, comprising;
   a. an input/output counter generating a plurality of counting signals in response to the test enable signal and the clock signal;
   b. an address counter generating a plurality of address signals in response to the counting signals;

c. an address selection circuit controlling a path of the address signals;
d. a plurality of switches divided into a predetermined number of switch groups and connected between a memory array and the data input/output pins; and
e. a switch control circuit generating switch control signals to control a switching operation of the switch groups, wherein the portion of the data input/output pins corresponds to the number of the switch groups.

5. The semiconductor device of claim 4, wherein the switches are designed as bi-directional data transmissions.

6. The semiconductor device of claim 4, wherein the semiconductor device is a nonvolatile memory device.

7. A semiconductor device including a plurality of memory chips on a wafer, each memory chip comprising:
a. a chip enable pin operable to receive a chip enable signal;
b. a write enable pin operable to receive a write enable signal;
c. a test enable pin operable to receive a test enable signal;
d. an input/output counter operable to generate counting signals in response to a clock signal;
e. a switch control circuit operable to generate switch control signals in response to the counting signals;
f. an address counter operable to generate address signals in response ti) the test enable signal and the counting signals; and
g. an address selection circuit operable to select addresses to be tested in a memory array in response to the address signals.

8. The semiconductor device of claim 7, wherein the input/output counter further comprises a first and a second D flip-flop serially connected to generate two counting signals.

9. The semiconductor device of claim 8, wherein the test enable signal is applied to the reset terminals of the two D flip-flops, an output terminal of the first flip-flop and an input terminal of the second flip-flop.

10. The semiconductor device of claim 7, wherein the switch control circuit further comprises:
a. An AND gate operable to receive an inverse of a first counting signal and an inverse of a second counting signal;
b. A first NOR gate operable to receive an output from the AND gate and an inverse test enable signal and to produce an inverse of a first switch control signal;
c. A first NAND gate operable to receive the first counting signal and the inverse of the second counting signal and to produce an inverse of second switch control signal;
d. A second NAND gate operable to receive the inverse of the first counting signal and the second counting signal and to produce an inverse of a third switch control signal; and
e. A third NAND gate operable to receive the first counting signal and the second counting signal and to produce an inverse of a fourth switch control signal.

11. The semiconductor device of claim 7, wherein the device further comprises at least one switch operable to receive the switch control signals, the switch comprising:
a. An inverter operable to invert a switch control signal; and
b. A transmission gate having a P-type and an N-type electrode operable to receive the inverted switch control signal and to produce data transmissions.

12. The switch of claim 11, wherein the switch is operable to be bi-directional.

* * * * *

UNITED STATES PATENT AND TRADEMARK OFFICE
CERTIFICATE OF CORRECTION

PATENT NO.    : 6,452,847 B2
DATED         : September 17, 2002
INVENTOR(S)   : Kim It is certified that error appears in the above-identified patent and that said Letters Patent is hereby corrected as shown below:

Column 4,
Line 13, "to the pins" should read -- to the pins DQ0~DQ3 --.

Column 6,
Line 19, "DQ0-DQ3" should read -- DQ0~DQ3 --.

Column 7,
Line 28, "in response ti)" should read -- in response to --.

Signed and Sealed this

Eighth Day of April, 2003

JAMES E. ROGAN
*Director of the United States Patent and Trademark Office*